United States Patent [19]
Ma et al.

[11] Patent Number: 6,154,366
[45] Date of Patent: Nov. 28, 2000

[54] STRUCTURES AND PROCESSES FOR FABRICATING MOISTURE RESISTANT CHIP-ON-FLEX PACKAGES

[75] Inventors: Qing Ma, San Jose; Chun Mu, Saratoga; Harry Fujimoto, Sunnyvale, all of Calif.; John Carruthers, Beaverton, Oreg.; Jian Li, Sunnyvale; Chuanbin Pan, San Jose, both of Calif.

[73] Assignee: Intel Corporation, Santa Clara, Calif.

[21] Appl. No.: 09/448,066

[22] Filed: Nov. 23, 1999

[51] Int. Cl.$^7$ ...................................................... H05K 7/20
[52] U.S. Cl. .......................... 361/704; 361/705; 361/708; 361/717; 361/718; 361/760; 361/761; 361/764; 361/765; 361/783; 257/700; 257/706; 257/707; 257/774; 257/787; 257/796
[58] Field of Search .................................... 361/704, 705, 361/707, 708, 717, 718, 760, 761, 764, 765, 783; 257/700, 706, 707, 774, 787, 796, 763

[56] References Cited

U.S. PATENT DOCUMENTS

| | | | |
|---|---|---|---|
| 4,544,989 | 10/1985 | Nakabu et al. ........................... | 361/764 |
| 5,353,498 | 10/1994 | Fillion et al. . | |
| 5,422,513 | 6/1995 | Marcinkiewicz et al. . | |
| 5,497,033 | 3/1996 | Fillion et al. . | |
| 5,527,741 | 6/1996 | Cole et al. . | |
| 5,650,662 | 7/1997 | Edwards et al. ......................... | 257/700 |
| 5,701,032 | 12/1997 | Fischer et al. ............................ | 257/692 |
| 5,703,400 | 12/1997 | Wojnarowski et al. . | |
| 5,745,984 | 5/1998 | Cole, Jr. et al. . | |
| 5,784,780 | 7/1998 | Loo ........................................... | 29/840 |
| 5,868,887 | 2/1999 | Sylvester et al. ....................... | 156/150 |
| 6,011,694 | 1/2000 | Hirakawa ................................ | 361/774 |
| 6,020,637 | 2/2000 | Karnezos ................................. | 257/738 |
| 6,025,995 | 2/2000 | Marcinkiewicz ....................... | 361/760 |

Primary Examiner—Leo P. Picard
Assistant Examiner—Boris L. Chervinsky
Attorney, Agent, or Firm—Robert G. Winkle

[57] ABSTRACT

A chip-on-flex package which includes at least one moisture barrier layer to prevent metal corrosion and delamination of flex component layers. An exemplary microelectronic package includes a microelectronic die having an active surface and at least one side, wherein the microelectronic die active surface includes at least one contact. A flex component is attached by a first surface to the microelectronic die active surface. At least one conductive trace is disposed on a second surface of the flex component and extends through the flex component to contact at least one of the contacts. An encapsulation material is adjacent the microelectronic die side and a bottom surface of the flex component. A moisture barrier is disposed on the flex component and the conductive trace(s). A second moisture barrier may be disposed on the encapsulation material. A heat dissipation device may also be incorporated into the chip-on-flex package.

29 Claims, 13 Drawing Sheets

STRUCTURES AND PROCESSES FOR FABRICATING MOISTURE RESISTANT CHIP-ON-FLEX PACKAGES

BACKGROUND OF THE INVENTION

1. Field of the Invention

The present invention relates to apparatus and processes for packaging microelectronic dice. In particular, the present invention relates to a chip-on-flex packaging technology which includes at least one moisture barrier layer to prevent metal corrosion and delamination of flex component layers.

2. State of the Art

Higher performance, lower cost, increased miniaturization of integrated circuit components, and greater packaging density of integrated circuits are ongoing goals of the computer industry. As these goals are achieved, microelectronic dice become smaller. Of course, the goal of greater packaging density requires that the entire microelectronic die package be equal to or only slightly larger (about 10% to 30%) than the size of the microelectronic die itself. Such microelectronic die packaging is called a "chip scale packaging" or "CSP".

One packaging technology, which is applicable to single chip packages and meets chip scale packaging goals, is called Chip-on-Flex ("COF") packaging. FIGS. 5a–5g illustrate an exemplary process for forming a COF package. As shown in FIG. 5a, a flex component 202 is attached (such as with a layer of adhesive—not shown) to an active surface 204 of a microelectronic die 206. The microelectronic die active surface 204 includes at least one contact 208. The microelectronic die 206 is then encapsulated with an encapsulating material 212, such as plastics, resins, and the like, as shown in FIG. 5b, that covers a back surface 214 and side(s) 216 of the microelectronic die 206, and abuts a bottom surface 218 of the flex component 202 (the portion not covered by the microelectronic die 206). The encapsulation of the microelectronic die 106 may be achieved by any known process, including but not limited to injection, transfer, and compression molding.

As shown in FIG. 5c, a plurality of conductive traces 224 are formed on an upper surface 226 of the flex component 202 and extend into vias 228 (formed through the flex component 202) to contact the contacts 208. The vias 228 may be formed by any known technique, but are general formed by laser ablation. The conductive traces 224 may also be formed by any known technique, such as photolithography.

A plurality of additional flex component layers are stacked by attaching one atop another, represented by elements 202' and 202", with additional conductive traces formed thereon, represented by elements 224' and 224", as shown in FIG. 5d. A layer of solder resist 232 is then applied over the uppermost flex component layer and conductive traces, represented by elements 202" and 224", respectively, as shown in FIG. 5e. A plurality of vias 234 are formed through the solder resist layer 232 to expose a portion of the uppermost conductive trace, represented as element 224", as shown in FIG. 5f. As shown in FIG. 5g, external contacts are formed on the conductive traces 224" (shown as solder balls 236), such as by any known plating technique.

Such COF packaging has been used in lower cost and/or lower volume (e.g., "low-end chips"). However, as COF packaging becomes a more common packaging technique, high-end chips are being packaged with the COF packaging technique. Unfortunately, one problem with COF packaging is that moisture can easily diffuse into the packages and cause metal corrosion and delamination of the flex component layers. As high-end chips are relatively expensive and, thus, must be reliable, such moisture related problems must be addressed.

Therefore, it would be advantageous to develop new apparatus and techniques to provide moisture barrier(s) for COF packaging, while utilizing commercially available, widely practiced microelectronic fabrication techniques.

SUMMARY OF THE INVENTION

The present invention relates to a chip-on-flex packaging technology which includes at least one moisture barrier layer to prevent metal corrosion and delamination of flex component layers. An exemplary microelectronic package of the present invention includes a microelectronic die having an active surface and at least one side, wherein the microelectronic die active surface includes at least one contact. A flex component is attached by a first surface to the microelectronic die active surface. At least one conductive trace is disposed on a second surface of the flex component and extends through the flex component to contact at least one of the contacts. An encapsulation material is adjacent the microelectronic die side and a bottom surface of the flex component. A moisture barrier is disposed on the flex component and the conductive trace(s).

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE ILLUSTRATED EMBODIMENT

Figure 1A:
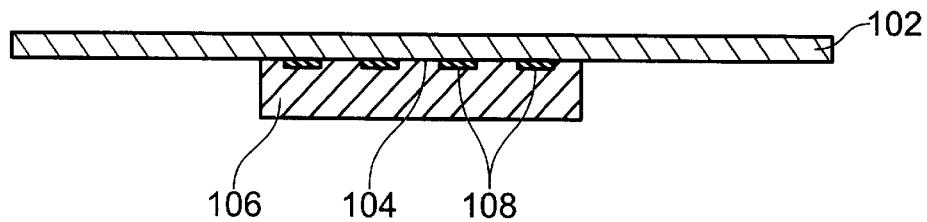
FIGS. 1a–1j are side cross-sectional views of a first embodiment of a process of forming a COF package, according to the present invention.
Figure 1B:
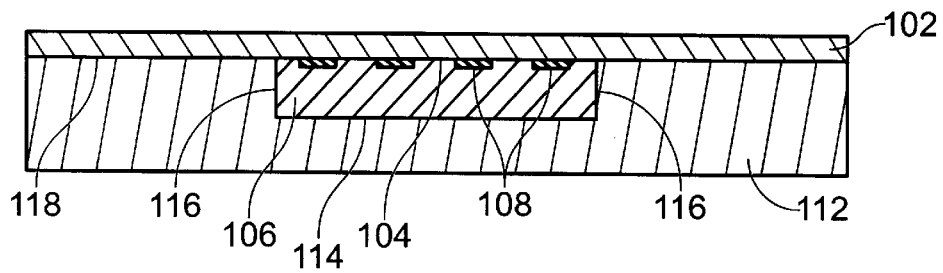

Although FIGS. 1a–1j, 2a–2j, 3a–3l, and 4 illustrate various views of the present invention, these figures are not meant to portray microelectronic assemblies in precise detail. Rather, these figures illustrate microelectronic assemblies in a manner to more clearly convey the concepts of the present invention. Additionally, elements common between the figures retain the same numeric designation. FIGS. 1a–1j illustrate a process for forming a moisture resistant COF package, according to the present invention. As shown in FIG. 1a, a flex component 102 is attached (such as with a layer of adhesive—not shown) to an active surface 104 of a microelectronic die 106. The microelectronic die active surface 104 includes at least one contact 108. The contacts 108 are in electrical contact with integrated circuitry (not shown) within the microelectronic die 106. The microelectronic die 102 is then encapsulated with an encapsulating material 112, such as plastics, resins, and the like, as shown in FIG. 1b, that covers a back surface 114 and side(s) 116 of the microelectronic die 106, and abuts a bottom surface 118 of the flex component 102 (the 10 portion not covered by the microelectronic die 106). The encapsulation of the microelectronic die 106 may be achieved by any known process, including but not limited to injection, transfer, and compression molding.

Figure 1C:
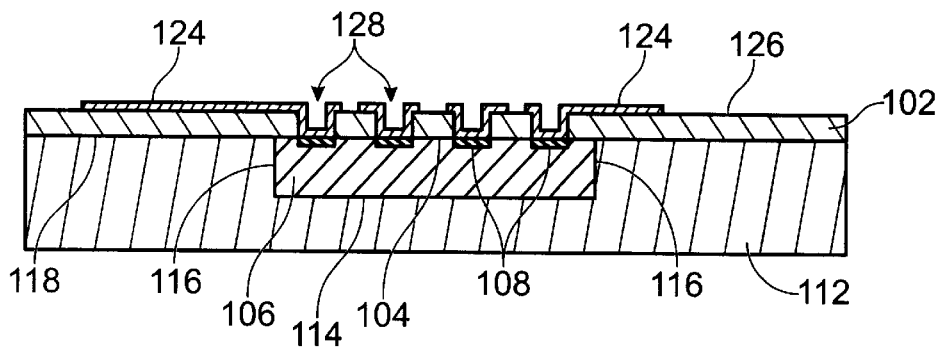

As shown in FIG. 1c, a plurality of conductive traces 124, such as aluminum, copper, alloys thereof, and the like, are formed on an upper surface 126 of the flex component 102 and extend into vias 128 formed in the flex component 102 to contact the contacts 108. The vias 128 and the conductive traces 124 may be formed by any known techniques.

Figure 1D:
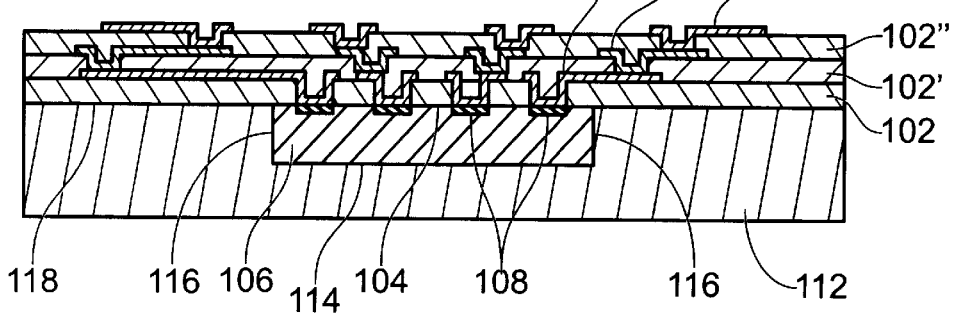
Figure 1E:
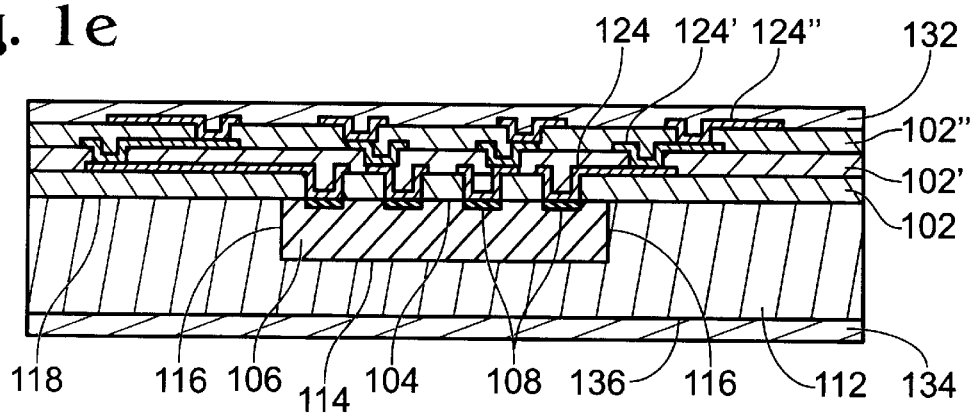

A plurality of additional flex component layers may be stacked by attaching one atop another, represented by elements 102' and 102", with additional conductive traces formed thereon, represented by elements 124' and 124", as shown in FIG. 1d. A first moisture barrier 132 is formed over the uppermost flex component layer and conductive traces, represented as elements 102" and 124", respectively, as shown in FIG. 1e. Optionally, a second moisture barrier 134 may be formed on a back surface 136 of the encapsulating material 112, as also shown in FIG. 1e. The second moisture barrier 134 may be employed if moisture incursion through the encapsulation material 112 becomes a problem.

Figure 1F:
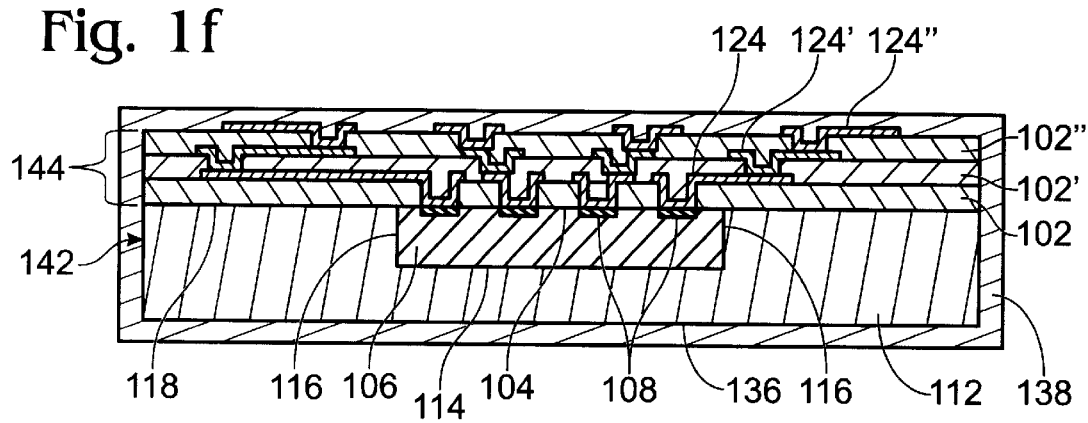

Alternately, as shown in FIG. 1f, a single moisture barrier layer 138 may be from to surround the uppermost flex component layer and conductive traces, the encapsulating material back surface 136, sides 142 of the encapsulated material structure, and sides 144 of the flex component layers.

Materials which suitable as moisture barriers include, but are not limited to, solgel oxides (preferable tungsten oxide), high density organic coatings (such as PCTFE (polychlorotrifluro-ethylene) or insulating photoresists, as known in the art, preferably between about 20 and 50 $\mu$m thick), and thin metal oxides.

Sol-gel oxides are formed by a solution process involving the transition of a material from a liquid (usually colloidal) into a solid phase. Generally, an inorganic metal salts or metal organic compounds (such as metal alkoxides) is subjected to a series of hydrolysis and polymeration reactions to form a colloidal suspension. The colloidal suspension can be formed in the moisture barrier by coating the colloidal suspension on the desired surface and dried (and/or heat treated) to convert the colloidal suspension into a dense ceramic material.

The metal oxides are preferably formed by depositing a thin metal film and oxidizing the thin metal film to form a continuous, dense metal oxide layer. The metal film is preferably between about 0.1 and 1 $\mu$m; however, the metal film need only be continuous to be effective. Preferably, metals such as titanium are used as they can be fully oxidized at relatively low temperatures (less than 200° C. of titanium).

Figure 1G:
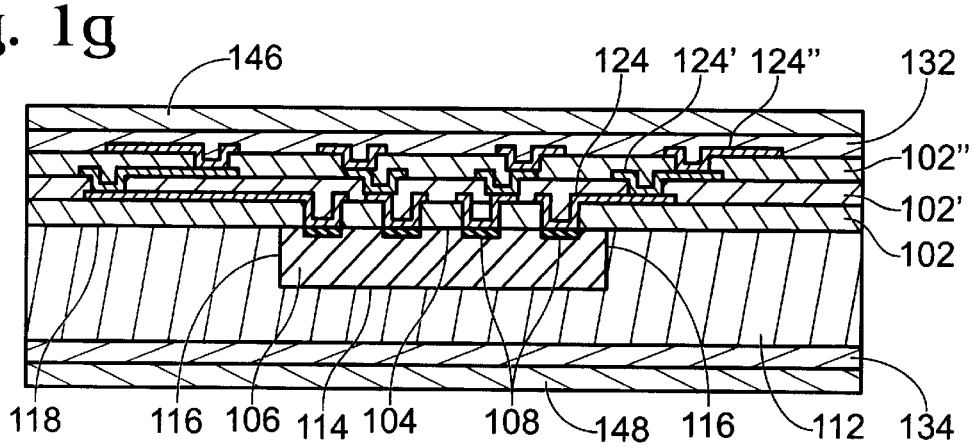
Figure 1H:
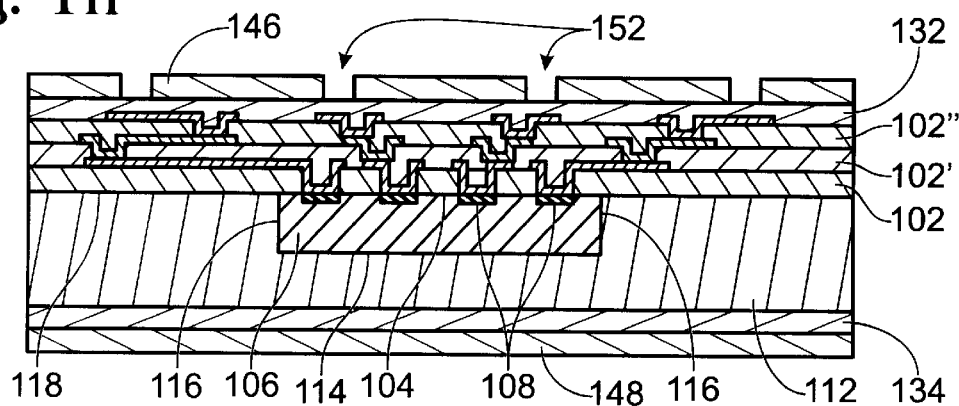
Figure 1I:
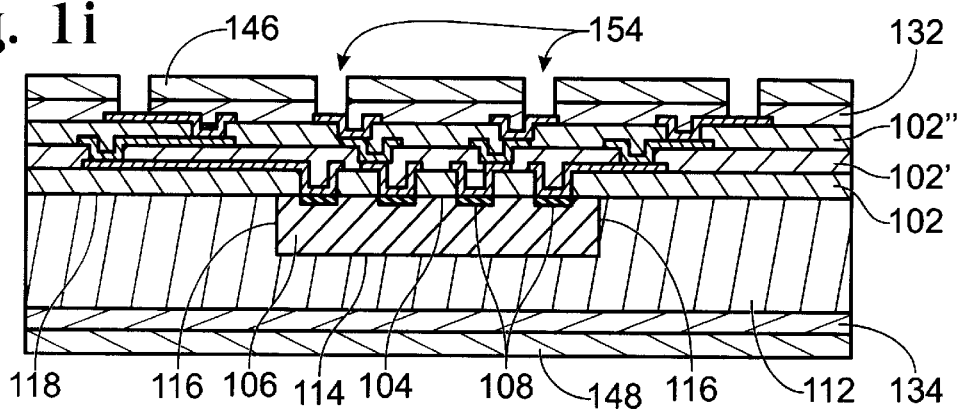
Figure 1J:
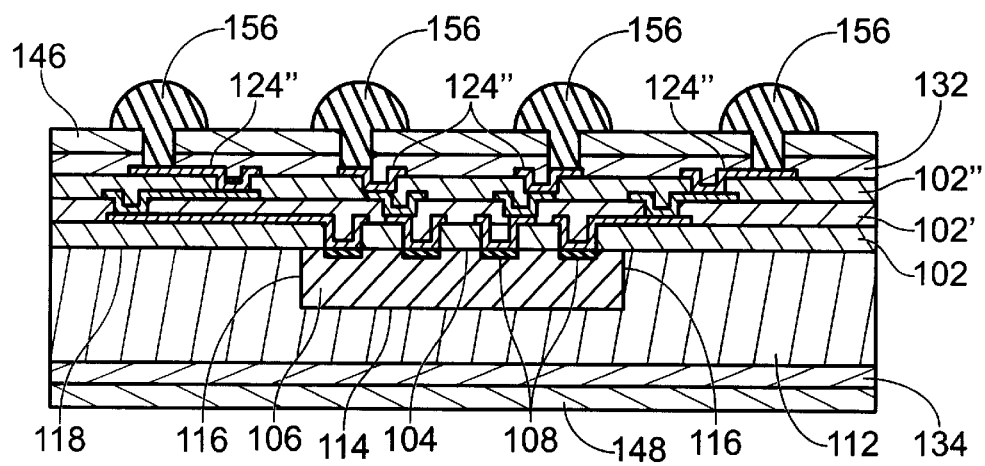

Referring to FIG. 1g, a first solder resist layer 146 is formed over the first moisture barrier 132 and a second solder resist layer 148 is formed over the second moisture barrier 134 (if the second moisture barrier 134 is employed). As shown in FIG. 1h, a plurality of vias 152 are formed through the first solder resist layer 146 to expose a portion of the first moisture barrier 132. A depth of the plurality of vias 152 is extended through the first moisture barrier 132 to expose the uppermost conductive trace, represented as element 124", as shown in FIG. 1i, to form depth vias 154. The vias 152 and deep vias 154 may be formed by any known via formation technique. External contacts are formed on the conductive traces 124" (shown as solder balls 156), as shown in FIG. 1j, such as by a plating technique.

Figure 2A:
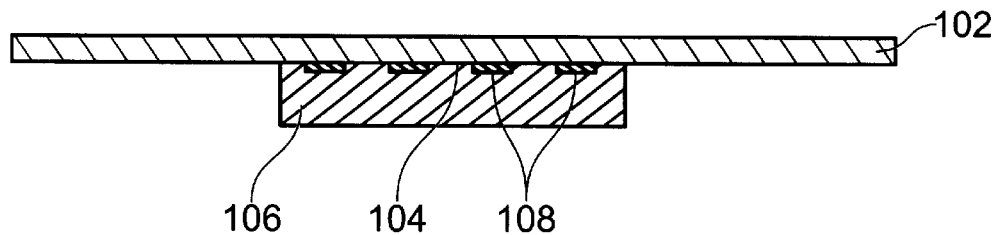
FIGS. 2a–2j are side cross-sectional views of another embodiment of a process of forming a COF package, according to the present invention.
Figure 2B:
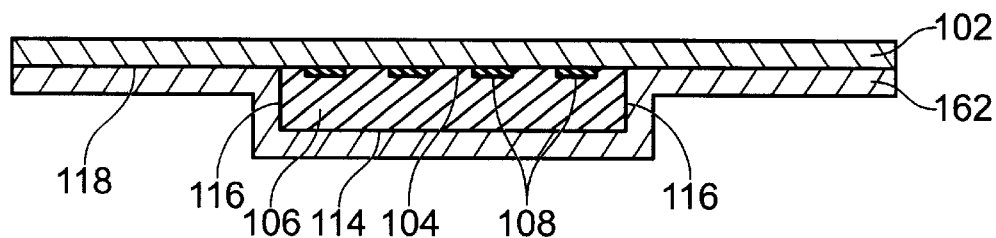
Figure 2C:
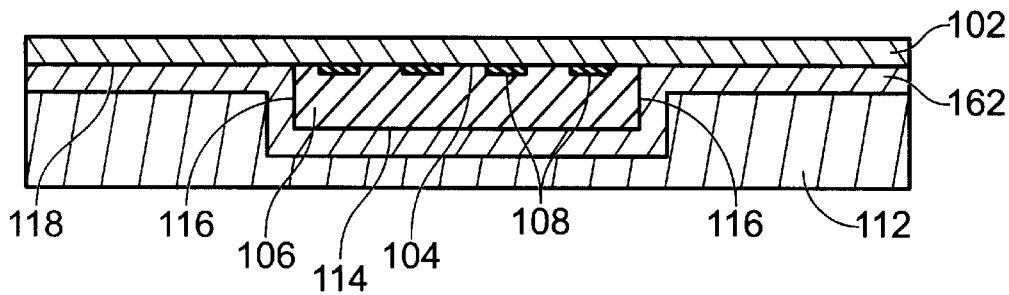
Figure 2D:
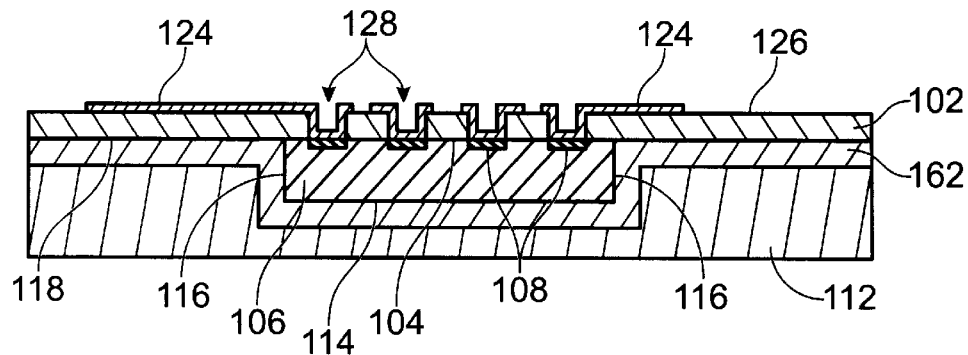

FIGS. 2a–2j illustrate another process for forming a moisture resistant COF package, according to the present invention. As shown in FIG. 2a, a flex component 102 is attached to an active surface 104 of a microelectronic die 106. The microelectronic die active surface 104 includes at least one contact 108. A back side moisture barrier layer 162 is formed to cover the back surface 114 and side(s) 116 of the microelectronic die 106, and abuts the flex component bottom surface 118 (the portion not covering the microelectronic die active 106), as shown in FIG. 2b. The encapsulating material 112 is then formed to abut the back side moisture barrier layer 162, as shown in FIG. 2c. As shown in FIG. 2d, the plurality of conductive traces 124 are formed on the upper surface 126 of the flex component 102 and extend into vias 128 formed in the flex component 102 to contact the contacts 108.

Figure 2E:
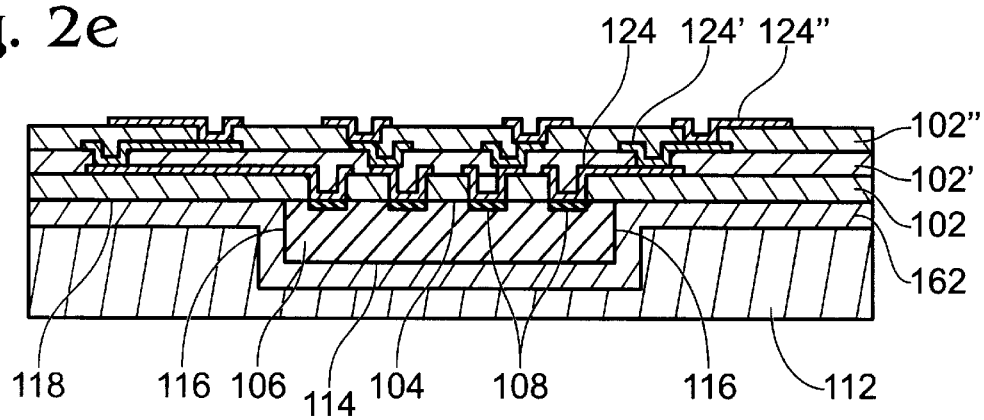
Figure 2F:
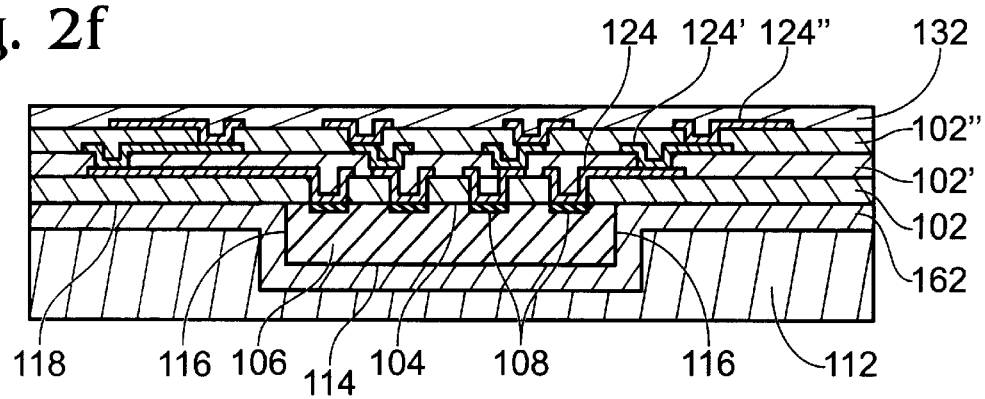

A plurality of additional flex component layers are stacked by attaching one atop another, represented by elements 102' and 102", with additional conductive traces formed thereon, represented by elements 124' and 124", as shown in FIG. 2e. The first moisture barrier 132 is formed over the uppermost flex component layer and conductive traces, represented by elements 102" and 124", respectively, as shown in FIG. 2f.

Figure 2G:
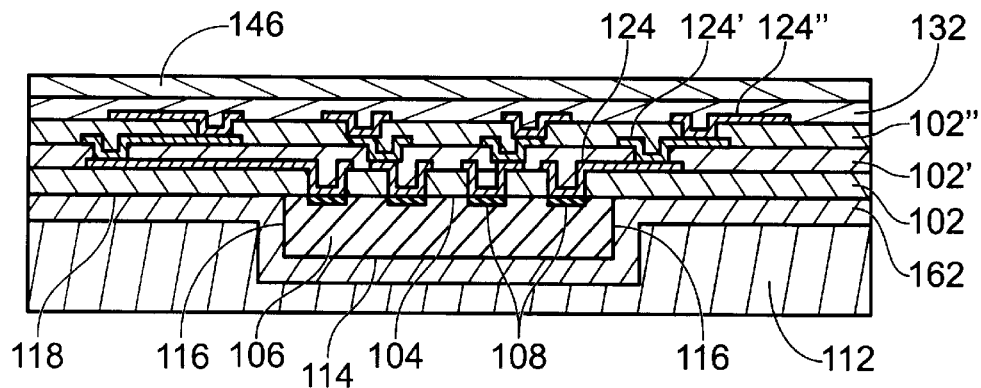
Figure 2H:
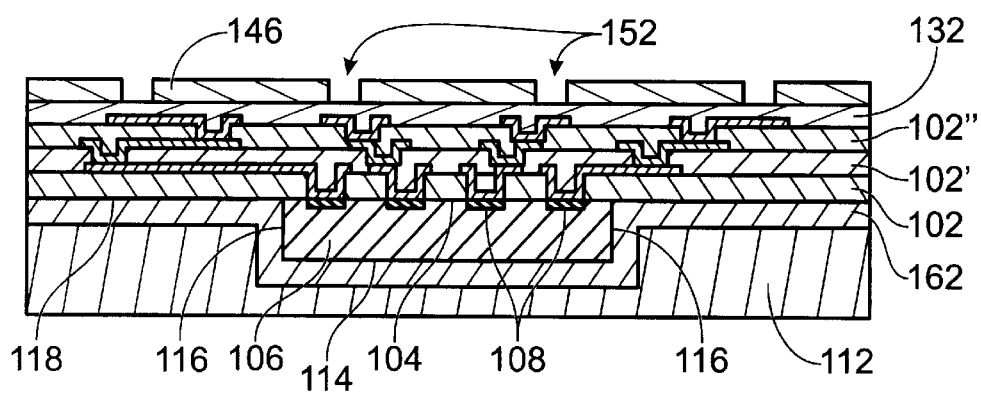
Figure 2I:
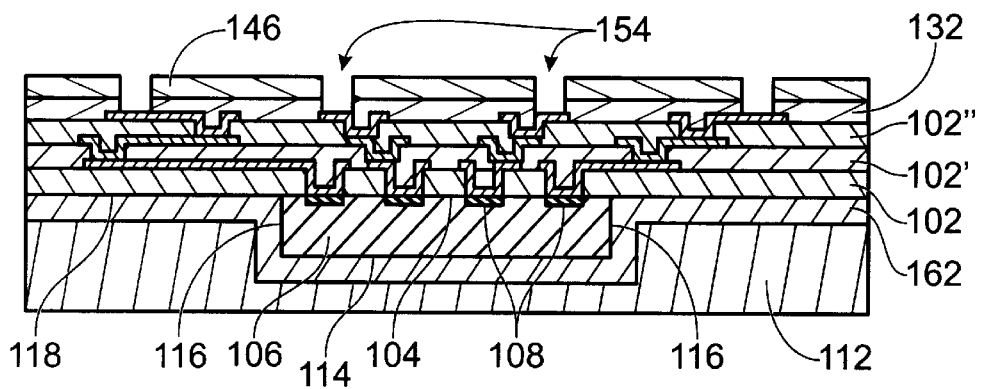
Figure 2J:
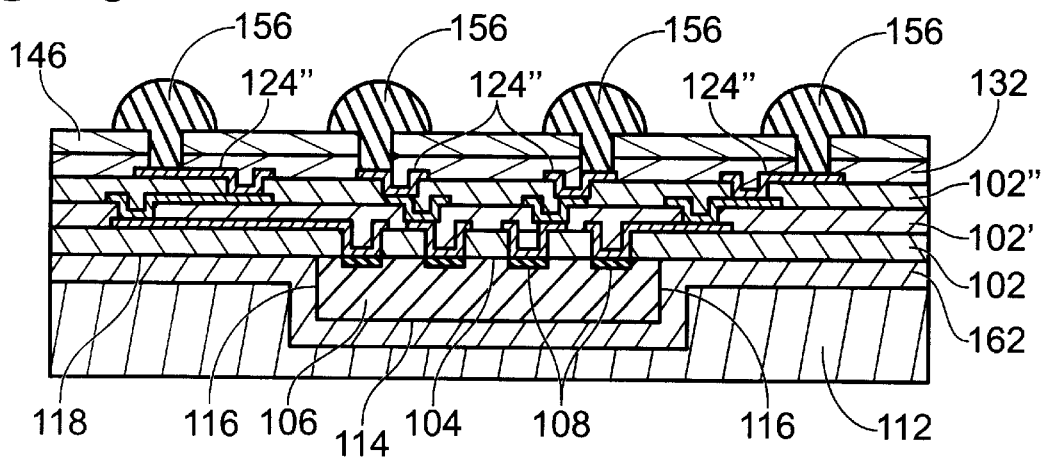

As shown in FIG. 2g, the first solder resist layer 146 is formed over the first moisture barrier 132. A plurality of vias 152 are formed through the first solder resist layer 146 to expose a portion of the first moisture barrier 132, as shown in FIG. 2h. A depth of the plurality of vias 152 is extended through the first moisture barrier 132 to expose the uppermost conductive trace, represented as element 124", as shown in FIG. 2i, to form deep vias 154. External contacts are formed on the conductive traces 124" (shown as solder balls 156), as shown in FIG. 2j.

Figure 3A:
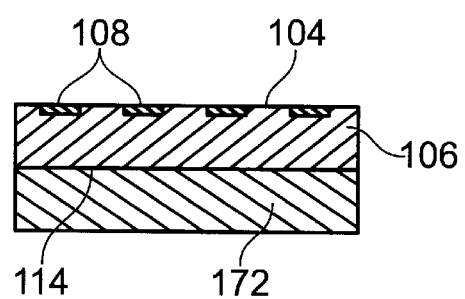
FIGS. 3a–3l are side cross-sectional views of an embodiment of a process of forming a COF package that incorporates a heat dissipation device, according to the present invention.
Figure 3B:
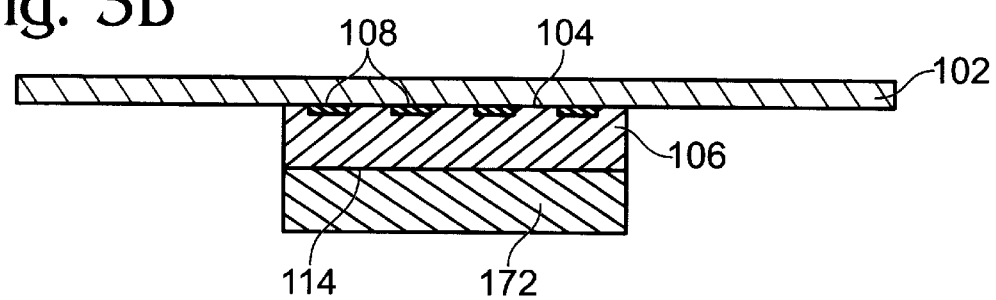
Figure 3C:
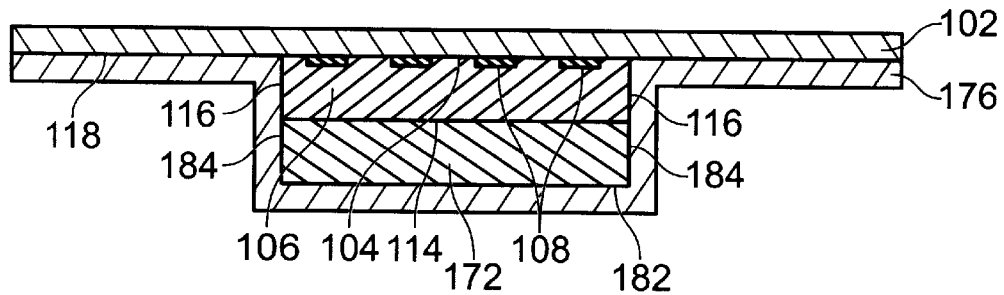
Figure 3D:
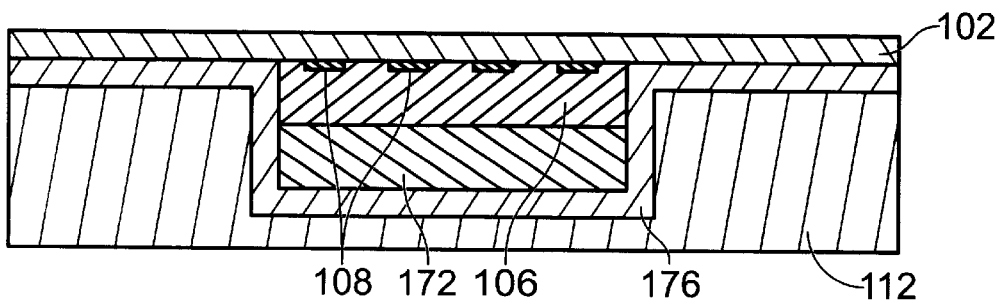

FIGS. 3a–3l illustrate still another embodiment of a process of forming a moisture resistant COF package, according of the present invention. As shown in FIG. 3a, a heat dissipation device (illustrated as heat slug 172) is attached to and in thermal contact with the microelectronic die back surface 114. The microelectronic die active surface 104 includes at least one contact 108. The flex component back surface 118 is attached to the active surface 104 of the microelectronic die 106, as shown in FIG. 3b. A back side moisture barrier layer 176 is formed to cover a back surface 182 and side(s) 184 of the heat slug 172, the microelectronic die side(s) 114, and abuts the flex component bottom surface 118 (the portion not covering the microelectronic die active 106), as shown in FIG. 3c. As shown in FIG. 3d, the microelectronic die 102 and heat slug 172 are encapsulated in the encapsulation material 112, wherein the encapsulation material 112 abuts the first moisture barrier 176.

Figure 3E:
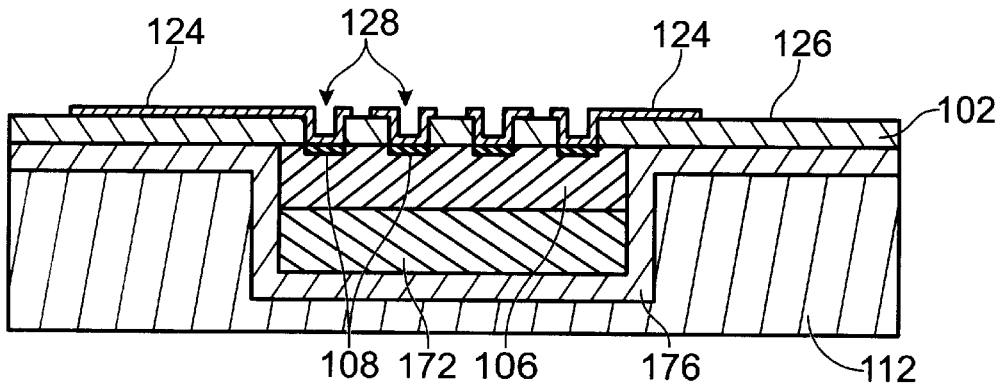

As shown in FIG. 3e, the plurality of conductive traces 124 are formed on the upper surface 126 of the flex component 102 and extend into vias 128 formed through the flex component 102 to contact the contacts 108.

Figure 3F:
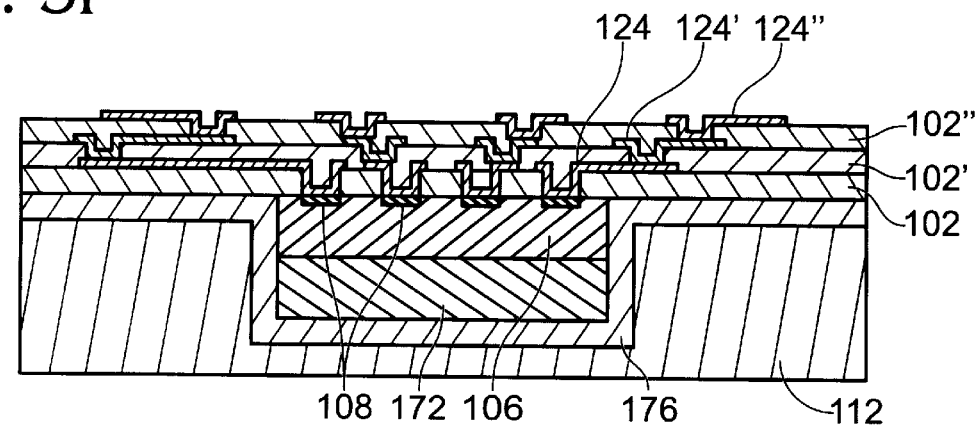
Figure 3G:
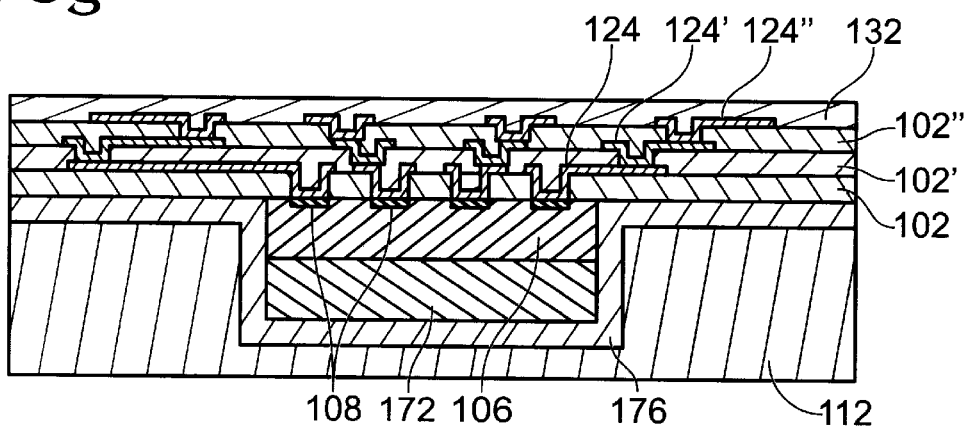

A plurality of additional flex component layers are stacked by attaching one atop another, represented by elements 102' and 102", with additional conductive traces formed thereon, represented by element 124' and 124", as shown in FIG. 3f. The first moisture barrier 132 is formed over the uppermost flex component layer and conductive traces, represented by elements 102" and 124", respectively, as shown in FIG. 3g.

Figure 3H:
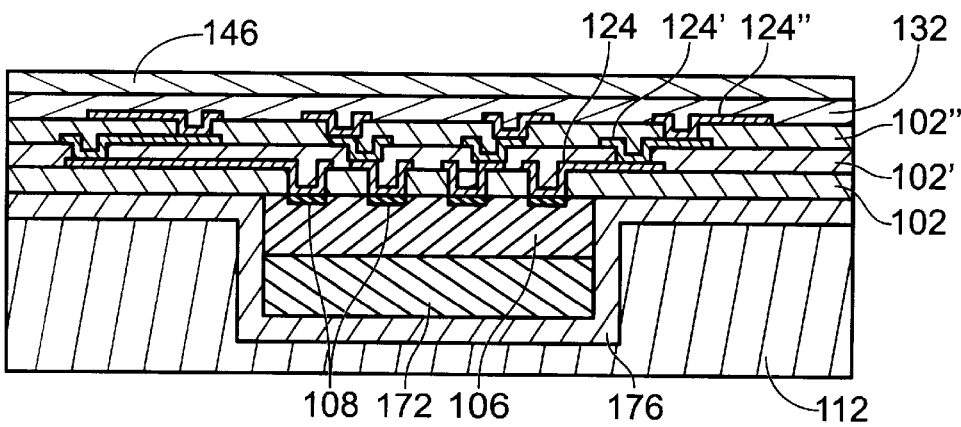
Figure 3I:
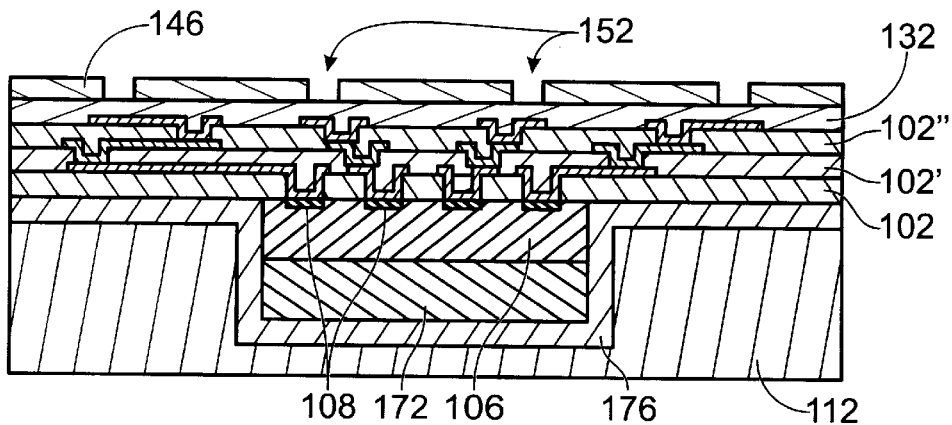
Figure 3J:
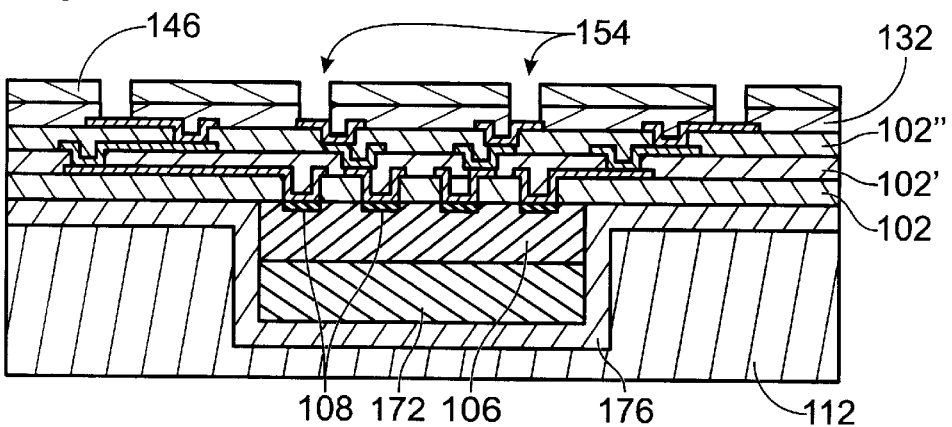
Figure 3K:
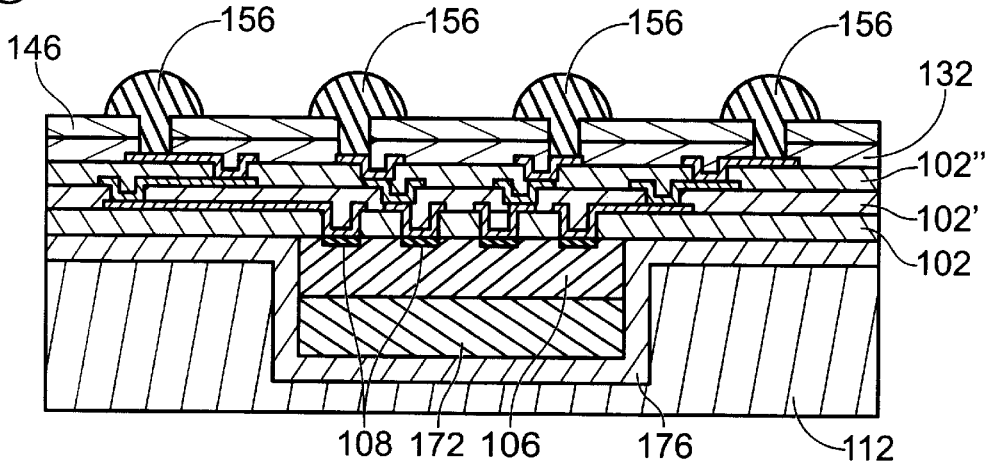

As shown in FIG. 3h, the first solder resist layer 146 is formed over the first moisture barrier 132. A plurality of vias 152 are formed through the first solder resist layer 146 to expose a portion of the first moisture barrier 132, as shown in FIG. 3i. A depth of the plurality of vias 152 is extended through the first moisture barrier 132 to expose the uppermost conductive trace, represented as element 124", as shown in FIG. 3j, to form depth vias 154. External contacts are formed on the conductive traces 124" (shown as solder balls 156), as shown in FIG. 3k.

Figure 3L:
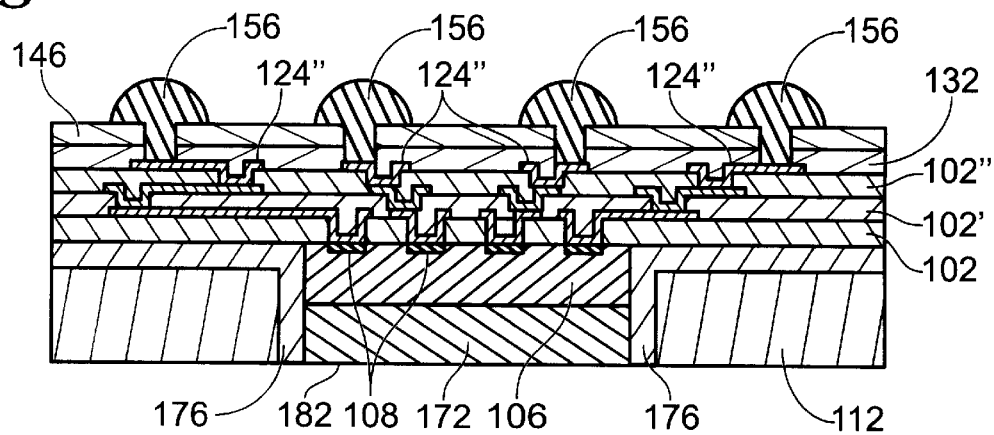

As shown in FIG. 3l, portions of the encapsulation material 112 and the back side moisture barrier layer 176 are removed, such as by abrasion or etching, to expose the heat slug back surface 182, so that thermal energy drawn into the heat slug 172 from the microelectronic die 106 can be dissipated to the ambient environment from the heat slug back surface 182, or so that an addition heat dissipation device can be attached to the heat slug back surface 182.

Figure 4:
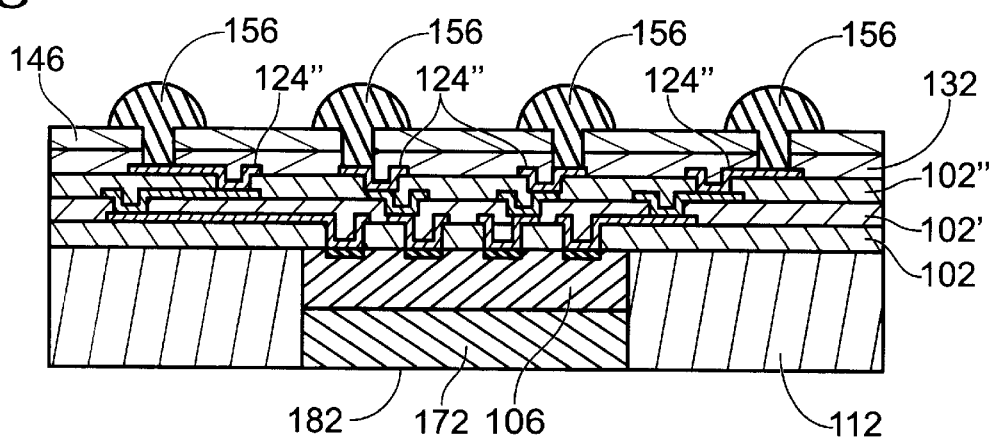
FIG. 4 is a side cross-sectional views of another embodiment of a COF package with a heat dissipation device formed by the method illustrated in FIGS. 1a–l according to the present invention.
Figure 5A:
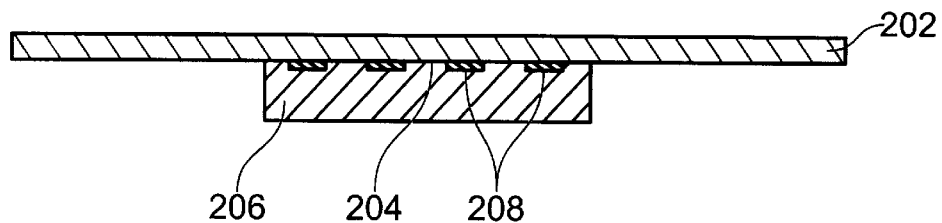
FIGS. 5a–5g are side cross-sectional views of a method for forming a COF package, as known in the art.
Figure 5B:
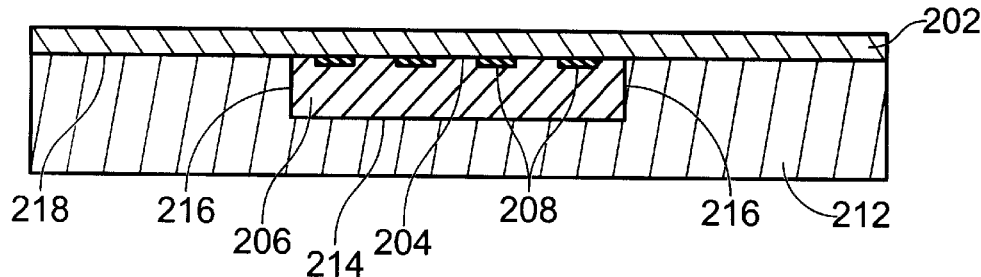
Figure 5C:
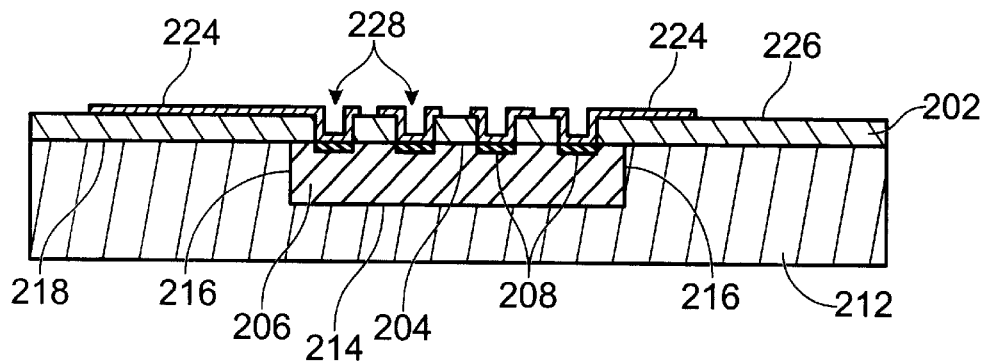
Figure 5D:
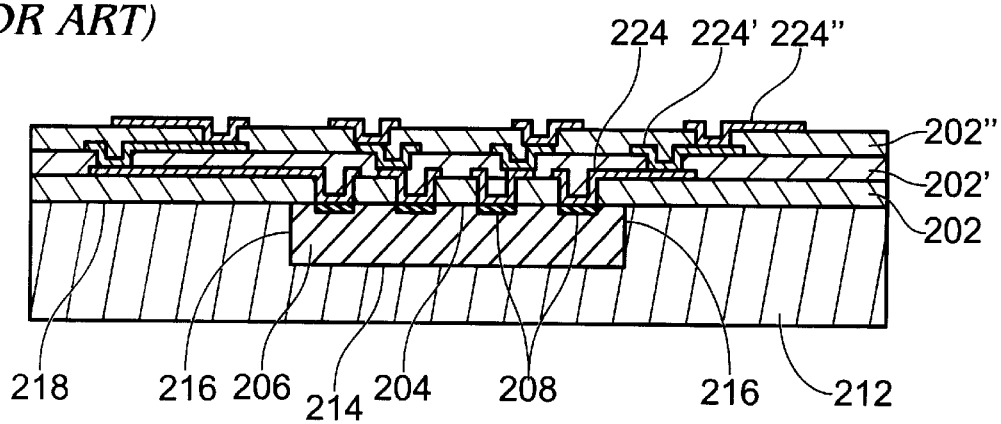
Figure 5E:
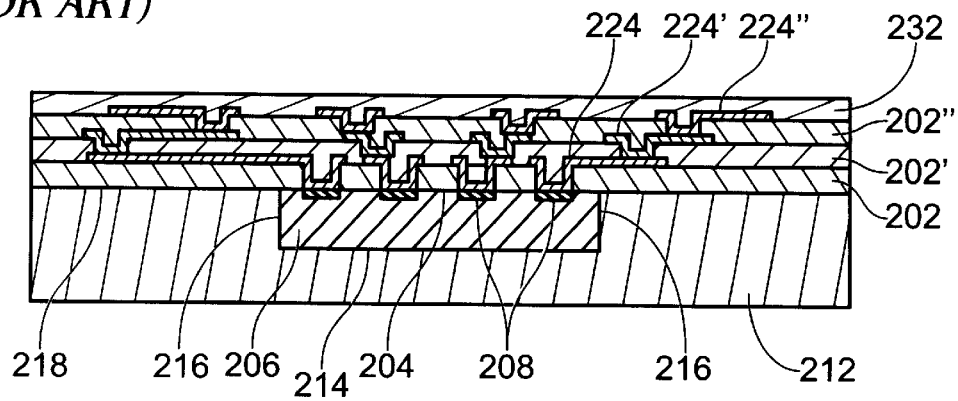
Figure 5F:
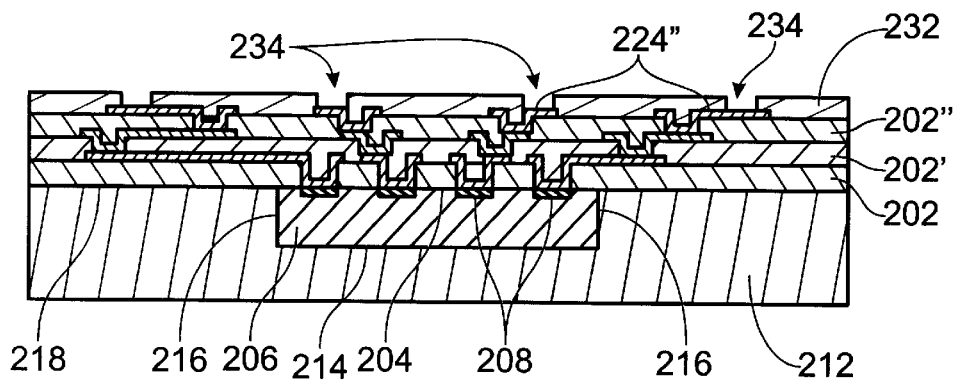
Figure 5G:
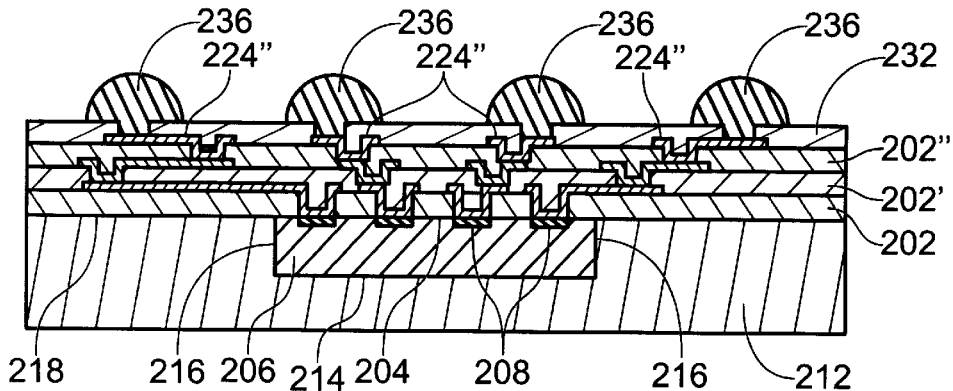

It is, of course, understood that a heat dissipation device, such as heat slug 172, could be incorporated into the process illustrated in FIGS. 1a–1j to form the structure illustrated in FIG. 4.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. A microelectronic package, comprising:
    a microelectronic die having an active surface, a back surface, and at least one side, said microelectronic die active surface including at least one contact;
    a flex component having a first surface attached to said microelectronic die active surface;
    at least one conductive trace disposed on a second surface of said flex component, wherein a portion of said at least one conductive trace extends through said flex component to contact said at least one said contact;
    encapsulation material adjacent said at least one microelectronic die side, wherein a first surface of said encapsulation material is adjacent said bottom surface of said flex component; and
    a first moisture barrier disposed on said flex component and said at least one conductive trace.

2. The microelectronic package of claim 1, wherein said first moisture barrier comprises a metal oxide.

3. The microelectronic package of claim 2, wherein said metal oxide is selected from the group consisting of tungsten oxide and titanium oxide.

4. The microelectronic package of claim 1, wherein said first moisture barrier comprises an organic coating.

5. The microelectronic package of claim 4, wherein said organic coating comprises polychloro-trifluro-ethylene.

6. The microelectronic package of claim 1, further including a second moisture barrier disposed on a second surface of said encapsulation material.

7. The microelectronic package of claim 6, wherein said second moisture barrier comprises a metal oxide.

8. The microelectronic package of claim 7, wherein said metal oxide is selected from the group consisting of tungsten oxide and titanium oxide.

9. The microelectronic package of claim 6, wherein said second moisture barrier comprises an organic coating.

10. The microelectronic package of claim 9, wherein said organic coating comprises polychloro-trifluro-ethylene.

11. The microelectronic package of claim 1, further including a heat dissipation device in thermal contact with said microelectronic die back surface.

12. A microelectronic package, comprising:
    a microelectronic die having an active surface, and at least one side, said microelectronic die active surface including at least one contact;
    a flex component having a first surface attached to said microelectronic die active surface;
    at least one conductive trace disposed on a second surface of said flex component, wherein a portion of said at least one conductive trace extends through said flex component to contact said at least one said contact;
    a back side moisture barrier adjacent said at least one microelectronic die side and said bottom surface of said flex component;
    encapsulation material adjacent said back side moisture barrier; and
    a moisture barrier disposed on said flex component and said at least one conductive trace.

13. The microelectronic package of claim 12, wherein said moisture barrier comprises a metal oxide.

14. The microelectronic package of claim 13, wherein said metal oxide is selected from the group consisting of tungsten oxide and titanium oxide.

15. The microelectronic package of claim 12, wherein said moisture barrier comprises an organic coating.

16. The microelectronic package of claim 15, wherein said organic coating comprises polychloro-trifluro-ethylene.

17. The microelectronic package of claim 12, wherein said back side moisture barrier comprises a metal oxide.

18. The microelectronic package of claim 17, wherein said metal oxide is selected from the group consisting of tungsten oxide and titanium oxide.

19. The microelectronic package of claim 12, wherein said back side moisture barrier comprises an organic coating.

20. The microelectronic package of claim 19, wherein said organic coating comprises polychloro-trifluro-ethylene.

21. The microelectronic package of claim 12, further including a heat dissipation device in thermal contact with said microelectronic die back surface.

22. A method of fabrication a microelectronic package, comprising:
    providing a microelectronic die having an active surface, a back surface, and at least one side, said microelectronic die active surface including at least one contact;
    attaching a first surface of a flex component to said microelectronic die active surface;
    disposing at least one conductive trace on a second surface of said flex component, wherein a portion of said at least one conductive trace extends through said flex component to contact said at least one said contact;
    disposing an encapsulation material adjacent said at least one microelectronic die side, wherein a first surface of said encapsulation material is adjacent said bottom surface of said flex component; and
    disposing a first moisture barrier on said flex component and said at least one conductive trace.

23. The method of claim 22, further comprising attaching a heat dissipation device to said microelectronic die back surface.

24. The method of claim 23, wherein said disposing said encapsulation material comprises disposing said encapsulation material adjacent at least one side of said heat dissipation device.

25. The method of claim 24, wherein said disposing said encapsulation material comprises disposing said encapsulation material adjacent a back surface of said heat dissipation device; and further comprising removing a portion of said encapsulation material to expose said heat dissipation device back surface.

26. A method of fabricating a microelectronic package, comprising:

provide a microelectronic die having an active surface, and at least one side, said microelectronic die active surface including at least one contact;

attaching a first surface of a flex component to said microelectronic die active surface;

disposing at least one conductive trace on a second surface of said flex component, wherein a portion of said at least one conductive trace extends through said flex component to contact said at least one said contact;

forming a back side moisture barrier adjacent said at least one microelectronic die side and said bottom surface of said flex component;

encapsulation material adjacent said back side moisture barrier; and disposing a moisture barrier on said flex component and said at least one conductive trace.

27. The method of claim 26, further comprising attaching a heat dissipation device to said microelectronic die back surface.

28. The method of claim 27, wherein said forming said back side moisture barrier further comprises forming said back side moisture barrier adjacent at least one side of said heat dissipation device.

29. The method of claim 28, wherein said forming said back side moisture barrier further comprises forming said back side moisture barrier adjacent a back side of said heat dissipation device; wherein said disposing said encapsulation material further comprises disposing said encapsulation material adjacent said moisture barrier adjacent said heat dissipation device back surface; and further comprising removing a portion of said encapsulation material and said moisture barrier to expose said heat dissipation device back surface.

\* \* \* \* \*

UNITED STATES PATENT AND TRADEMARK OFFICE
CERTIFICATE OF CORRECTION

PATENT NO. : 6,154,366 Page 1 of 1
DATED : November 28, 2000
INVENTOR(S) : Qing Ma; Xiao-Chun Mu; Harry Fujimoto; John Carruthers; Jian Li; Chuanbin Pan It is certified that error appears in the above-identified patent and that said Letters Patent is hereby corrected as shown below:

The following inventor's name is spelled incorrectly:

Listed as: CHUN MU

Should be: XIAO-CHUN MU

Signed and Sealed this

Second Day of October, 2001

*Attest:*

*Attesting Officer*

NICHOLAS P. GODICI
*Acting Director of the United States Patent and Trademark Office*